United States Patent
Yuasa et al.

(10) Patent No.: US 6,277,730 B1
(45) Date of Patent: *Aug. 21, 2001

(54) METHOD OF FABRICATING INTERCONNECTS UTILIZING FLUORINE DOPED INSULATORS AND BARRIER LAYERS

(75) Inventors: Hiroshi Yuasa; Satoshi Ueda, both of Osaka (JP)

(73) Assignee: Matsushita Electronics Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/249,844

(22) Filed: Feb. 16, 1999

(30) Foreign Application Priority Data

Feb. 17, 1998 (JP) .................................................. 10-035152

(51) Int. Cl.[7] .............................................. H01L 71/4763
(52) U.S. Cl. ........................ 438/627; 438/637; 438/622; 257/758
(58) Field of Search ................................... 439/637, 627, 439/625, 622, 399; 257/758

(56) References Cited

U.S. PATENT DOCUMENTS

| 5,521,424 | * | 5/1996 | Ueno et al. | 257/632 |
| 5,763,937 | * | 6/1998 | Jain et al. | 257/646 |
| 5,804,470 | * | 9/1998 | Wollesen | 438/141 |
| 5,821,168 | * | 10/1998 | Jain | 438/692 |
| 5,830,804 | * | 11/1998 | Cleeves et al. | 438/672 |
| 5,859,458 | * | 1/1999 | Hsueh et al. | 257/347 |
| 5,930,655 | * | 7/1999 | Cooney, III et al. | 438/474 |
| 5,940,725 | * | 8/1999 | Hunter et al. | 438/592 |
| 5,968,333 | * | 10/1999 | Nogami et al. | 205/184 |

FOREIGN PATENT DOCUMENTS

| 06-302704 | 10/1994 | (JP) . |
| 09-246242 | 9/1997 | (JP) . |
| 09-275138 | 10/1997 | (JP) . |
| 10-041385 | 2/1998 | (JP) . |

* cited by examiner

Primary Examiner—Steven Loke
Assistant Examiner—Douglas W. Owens
(74) Attorney, Agent, or Firm—Eric J. Robinson; Nixon Peabody LLP

(57) ABSTRACT

A plurality of lower-level metal interconnects are formed over a semiconductor substrate. A first fluorine-containing insulating film, made of a fluorine-doped insulator, is formed to fill in gaps between adjacent ones of the lower-level metal interconnects over the semiconductor substrate. An interlevel insulating film is formed over the lower-level metal interconnects and the first fluorine-containing insulating film. And a plurality of upper-level metal interconnects are formed on the interlevel insulating film. The interlevel insulating film includes: a second fluorine-containing insulating film made of a fluorine-doped insulator; and a silicon-rich insulating film containing a larger quantity of silicon than a quantity defined by stoichiometry.

5 Claims, 9 Drawing Sheets

METHOD OF FABRICATING INTERCONNECTS UTILIZING FLUORINE DOPED INSULATORS AND BARRIER LAYERS

BACKGROUND OF THE INVENTION

The present invention generally relates to a semiconductor device, and more particularly relates to a semiconductor device including a fluorine-containing insulating film, made of an insulator doped with fluorine, between metal interconnects and a method for fabricating such a device.

Hereinafter, a semiconductor device including a fluorine-containing insulating film, made of an insulator doped with fluorine, between metal interconnects will be described with reference to FIG. 9.

As shown in FIG. 9, an insulating film 2, made of silicon dioxide, is formed on a semiconductor substrate 1. On the insulating film 2, a plurality of lower-level metal interconnects 3 are formed. Each of these metal interconnects 3 has a multilayer structure formed by stacking a first titanium film 3a, a first aluminum alloy film 3b and a first titanium nitride film 3c in this order. A fluorine-containing silicon dioxide film 4 is formed by doping a silicon dioxide film with fluorine to fill in the gaps between adjacent ones of the lower-level metal interconnects 3 and to cover all of these metal interconnects 3.

An ordinary silicon dioxide film 5 is formed on the fluorine-containing silicon dioxide film 4. And on the silicon dioxide film 5, a plurality of upper-level metal interconnects 6 are formed. Each of these metal interconnects 6 also has a multilayer structure formed by stacking a second titanium film 6a, a second aluminum alloy film 6b and a second titanium nitride film 6c in this order.

The relative dielectric constant of the fluorine-containing silicon dioxide film 4, formed by doping a silicon dioxide film with fluorine, is lower than that of the ordinary silicon dioxide film 5, which is not doped with fluorine. Thus, by providing an interlevel insulating film including the fluorine-containing silicon dioxide film 4 to fill in the gaps between the lower-level metal interconnects 3 and cover all of these interconnects 3, parasitic capacitances between the interconnects 3 themselves and between the lower- and upper-level metal interconnects 3, 6 can be reduced. As a result, signals can be transmitted with a reduced delay, thus enabling the use of signals with a higher frequency.

However, if the fluorine-containing silicon dioxide film 4 is interposed between the lower- and upper-level metal interconnects 3, 6, then fluorine, contained in the fluorine-containing silicon dioxide film 4, is likely to diffuse into the silicon dioxide film 5 during a subsequent heat treatment process. Such a phenomenon is called "auto-doping" in the pertinent art. Once fluorine has diffused into the silicon dioxide film 5, a degraded layer is formed in the interface between the second titanium film 6a, which is the lowermost layer of the upper-level metal interconnects 6, and the silicon dioxide film 5. Accordingly, the upper-level metal interconnects 6 come to make poorer contact with the silicon dioxide film 5, resulting in deterioration in reliability of the semiconductor device.

SUMMARY OF THE INVENTION

An object of this invention is improving the contact between upper-level metal interconnects and an interlevel insulating film by preventing fluorine, contained in a fluorine-containing silicon dioxide film filling in the gaps between lower-level metal interconnects and between the lower- and upper-level metal interconnects, from degrading the upper-level metal interconnects.

To achieve this object, the semiconductor device of the present invention includes: a plurality of lower-level metal interconnects formed over a semiconductor substrate; a first fluorine-containing insulating film made of a fluorine-doped insulator and formed to fill in gaps between adjacent ones of the lower-level metal interconnects over the semiconductor substrate; an interlevel insulating film formed over the lower-level metal interconnects and the first fluorine-containing insulating film; and a plurality of upper-level metal interconnects formed on the interlevel insulating film. The interlevel insulating film includes: a second fluorine-containing insulating film made of a fluorine-doped insulator; and a silicon-rich insulating film containing a larger quantity of silicon than a quantity defined by stoichiometry.

In the semiconductor device of the present invention, the first fluorine-containing insulating film is formed between adjacent ones of the lower-level metal interconnects and the second fluorine-containing insulating film is interposed between the lower- and upper-level metal interconnects. Accordingly, parasitic capacitances between the lower-level metal interconnects themselves and between the lower- and upper-level metal interconnects can be reduced, thus reducing the propagation delay of a signal transmitted through the device.

In addition, the interlevel insulating film includes a silicon-rich insulating film containing a larger quantity of silicon than a quantity defined by stoichiometry. Thus, during a subsequent heat treatment process, even if fluorine atoms, contained in the first or second fluorine-containing insulating film, are going to diffuse, these fluorine atoms are trapped by the dangling bonds of silicon atoms contained in the silicon-rich insulating film. As a result, the fluorine atoms are less likely to pass through the silicon-rich insulating film to reach the upper-level metal interconnects. Accordingly, no degraded layers are formed in the interface between the lower- or upper-level metal interconnects and the interlevel insulating film, thus improving the contact between the lower- or upper-level metal interconnects and the interlevel insulating film.

If a silicon-rich insulating film is formed over the second fluorine-containing insulating film, then the silicon-rich insulating film prevents the fluorine atoms, contained in the first and second fluorine-containing insulating films, from reaching the upper-level metal interconnects. And, if an additional silicon-rich insulating film is formed under the second fluorine-containing insulating film, then the silicon-rich insulating films prevent the fluorine atoms, contained in the first and second fluorine-containing insulating films, from reaching the upper- and lower-level metal interconnects, respectively.

Therefore, in the semiconductor device of the present invention, not only reduction in parasitic capacitances between the lower-level metal interconnects themselves and between the lower- and upper-level metal interconnects, but also improvement of contact between the lower- or upper-level metal interconnects and the interlevel insulating film are realized. As a result, a highly reliable semiconductor device can be provided.

In one embodiment of the present invention, the silicon-rich insulating film preferably includes: a first silicon-rich insulating film formed under the second fluorine-containing insulating film; and a second silicon-rich insulating film formed over the second fluorine-containing insulating film.

In such an embodiment, the fluorine atoms, contained in the first fluorine-containing insulating film, cannot reach the upper-level metal interconnects, while the fluorine atoms, contained in the second fluorine-containing insulating film, cannot reach the upper- or lower-level metal interconnects.

In another embodiment of the present invention, the silicon-rich insulating film is preferably a silicon-rich oxide film containing a larger quantity of silicon than a quantity defined by stoichiometry.

In this embodiment, the refractive index of the silicon-rich oxide film is preferably 1.48 or more. Then, the passage of fluorine atoms through the silicon-rich oxide film can be prevented with much more certainty.

In an alternate embodiment of the present invention, the silicon-rich insulating film is preferably a silicon-rich nitride film containing a larger quantity of silicon than a quantity defined by stoichiometry.

In this embodiment, the refractive index of the silicon-rich nitride film is preferably 2.05 or more. Then, the passage of fluorine atoms through the silicon-rich nitride film can be prevented with a lot more certainty.

In still another embodiment, the first and second fluorine-containing insulating films are preferably fluorine-containing silicon dioxide films formed by doping respective silicon dioxide films with fluorine.

In such an embodiment, the parasitic capacitances between the lower-level metal interconnects themselves and between the lower- and upper-level metal interconnects can be reduced with even more certainty.

A method for fabricating a semiconductor device according to the present invention includes the steps of: a) forming lower-level metal interconnects and a first fluorine-containing insulating film over a semiconductor substrate, the first fluorine-containing insulating film being made of a fluorine-doped insulator and interposed between adjacent ones of the lower-level metal interconnects; b) forming an interlevel insulating film to cover the lower-level metal inter-connects and the first fluorine-containing insulating film; and c) forming upper-level metal interconnects on the interlevel insulating film. The step b) includes the step of: forming a second fluorine-containing insulating film made of a fluorine-doped insulator; and forming a silicon-rich insulating film containing a larger quantity of silicon than a quantity defined by stoichiometry.

In accordance with the method of the present invention, an interlevel insulating film, including the second fluorine-containing insulating film made of a fluorine-doped insulator and the silicon-rich insulating film containing a larger quantity of silicon than a quantity defined by stoichiometry, can be formed with more certainty.

In one embodiment of the present invention, the step b) preferably includes: forming a first silicon-rich insulating film over the lower-level metal interconnects; forming the second fluorine-containing insulating film over the first silicon-rich insulating film; and forming a second silicon-rich insulating film over the second fluorine-containing insulating film.

In another embodiment of the present invention, the silicon-rich insulating film is preferably a silicon-rich oxide film containing a larger quantity of silicon than a quantity defined by stoichiometry.

In an alternate embodiment of the present invention, the silicon-rich insulating film is preferably a silicon-rich nitride film containing a larger quantity of silicon than a quantity defined by stoichiometry.

In still another embodiment, the first and second fluorine-containing insulating films are preferably fluorine-containing silicon dioxide films formed by doping respective silicon dioxide films with fluorine.

In this embodiment, the first and second fluorine-containing silicon dioxide films are preferably deposited by a plasma CVD process at a temperature in the range from 415° C. to 460° C.

Then, the fluorine atoms, contained in the fluorine-containing silicon dioxide films, are even less likely to be separated from the silicon atoms. Accordingly, the diffusion of fluorine atoms can be prevented with much more certainty.

DESCRIPTION OF THE PREFERRED EMBODIMENTS

Embodiment 1

Hereinafter, a semiconductor device according to the first embodiment of the present invention will be described with reference to FIG. 1.

Figure 1:
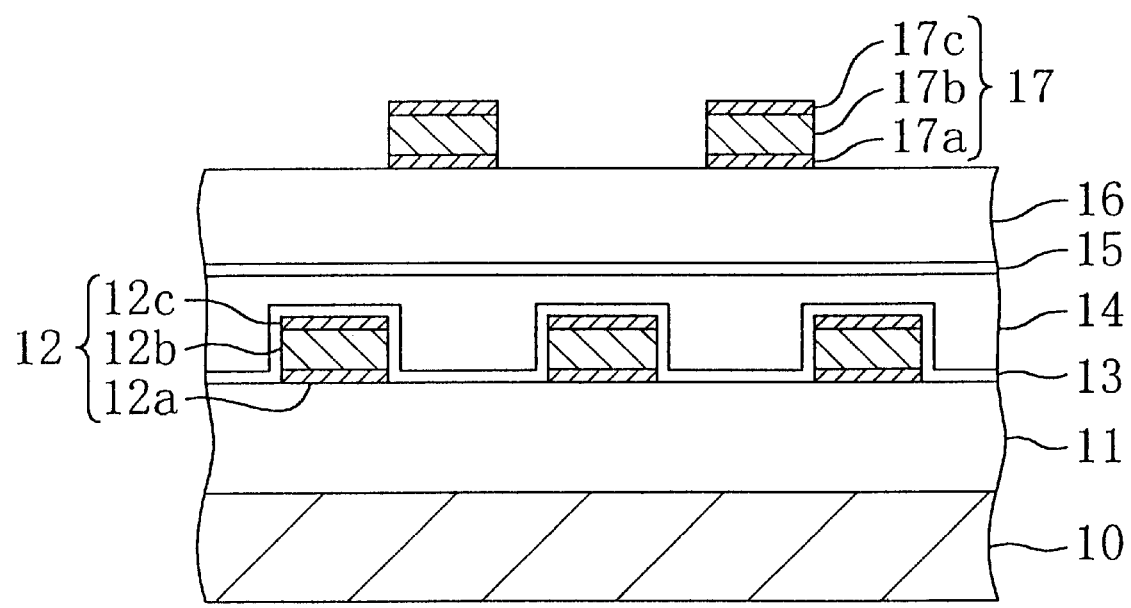
FIG. 1 is a cross-sectional view of a semiconductor device according to the first embodiment of the present invention.

FIG. 1 illustrates a cross-sectional structure of the semiconductor device according to the first embodiment. AS shown in FIG. 1, an insulating film 11, made of silicon dioxide, is formed on a semiconductor substrate 10. On the insulating film 11, a plurality of lower-level metal interconnects 12 are formed. Each of these metal interconnects 12 has a multilayer structure formed by stacking: a first titanium film 12a with an exemplary thickness of 50 nm; a first aluminum alloy film 12b with an exemplary thickness of 500 nm; and a first titanium nitride film 12c with an exemplary thickness of 50 nm in this order. It should be noted that the first aluminum alloy film 12b is preferably made of an aluminum alloy containing 0.5 atomic percent of copper (Cu) to prevent electromigration.

A first silicon-rich oxide film 13, containing a larger quantity of silicon than that defined by stoichiometry, is formed to cover the lower-level metal interconnects 12 and to be 20 nm thick, for example. A fluorine-containing silicon dioxide film 14 is formed over the first silicon-rich oxide film 13 by doping a silicon dioxide film with fluorine at a concentration of 5.0 atomic percent, for example. In this case, the fluorine-containing silicon dioxide film 14 is preferably formed to fill in gaps between adjacent ones of the lower-level metal interconnects 12 and to cover the lower-level metal interconnects 12. Part of the fluorine-containing silicon dioxide film 14, interposed between the lower-level metal interconnects 12, is defined as a "first fluorine-containing insulating film" in the appended claims. The other part of the fluorine-containing silicon dioxide film 14, overlying the lower-level metal interconnects 12, is defined as a "second fluorine-containing insulating film" in the claims and is preferably about 600 nm thick, for example. A second silicon-rich oxide film 15, containing a larger quantity of silicon than that defined by stoichiometry, is formed over the fluorine-containing silicon dioxide film 14 to be 20 nm thick, for example. And over the second silicon-rich oxide film 15, an ordinary silicon dioxide film 16, not doped with fluorine, is formed to be 400 nm thick, for example. The first silicon-rich oxide film 13, the fluorine-containing silicon dioxide film 14, the second silicon-rich oxide film 15 and the silicon dioxide film 16 together constitute an interlevel insulating film.

On the silicon dioxide film 16, a plurality of upper-level metal interconnects 17 are formed. Each of these metal interconnects 17 has a multilayer structure formed by stacking: a second titanium film 17a with an exemplary thickness of 50 nm; a second aluminum alloy film 17b with an exemplary thickness of 500 nm; and a second titanium nitride film 17c with an exemplary thickness of 50 nm in this order. It should be noted that the second aluminum alloy film 17b is also preferably made of an aluminum alloy containing 0.5 atomic percent of copper (Cu) to prevent electromigration.

The first and second titanium films 12a and 17a each reduce contact resistance between the metal interconnect and a contact (i.e., a tungsten plug). The first and second titanium nitride films 12c and 17c each function as an antireflection film during the formation of the metal interconnect by patterning metal films. And the silicon dioxide film 16 improves the contact between the fluorine-containing silicon dioxide film 14 and the upper-level metal interconnects 17.

In this embodiment, the first and second silicon-rich oxide films 13 and 15 are formed under and over the fluorine-containing silicon dioxide film 14, respectively. During a subsequent heat treatment process, fluorine atoms, contained in the fluorine-containing silicon dioxide film 14, are going to diffuse upward and downward. However, there are a great number of silicon atoms having extra bonds, or dangling bonds, in the first and second silicon-rich oxide films 13 and 15. Accordingly, the fluorine atoms are trapped by the dangling bonds of the silicon atoms contained in the first and second silicon-rich oxide films 13 and 15. That is to say, only a very small number of fluorine atoms, contained in the fluorine-containing silicon dioxide film 14, can reach the lower- and upper-level metal interconnects 12 and 17. Thus, no degraded layers are formed in the respective interfaces between the lower- and upper-level metal interconnects 12 and 17 and the interlevel insulating film. As a result, the contact between the lower- and upper-level metal interconnects 12 and 17 and the interlevel insulating film improves.

The quantity of silicon contained in the first and second silicon-rich oxide films 13 and 15 will be exemplified. The content of silicon in an ordinary silicon dioxide ($SiO_2$) film is defined by stoichiometry at about 33.3 atomic percent ($=\frac{1}{3}$). In contrast, the content of silicon in the first and second silicon-rich oxide films 13 and 15 is preferably set at about 35.0 atomic percent or more, e.g., about 36.2 atomic percent. This is because if the content of silicon is about 35.0 atomic percent or more, then the passage of fluorine atoms, contained in the fluorine-containing silicon dioxide film 14 at a concentration of 5.0 atomic percent, for example, can be prevented with much more certainty.

In general, a refractive index of a silicon dioxide film is often used as a barometer for measuring the concentration of silicon contained in the silicon dioxide film. That is to say, the larger the refractive index of a silicon dioxide film is, the higher the concentration of silicon in the silicon dioxide film would be. For example, when the content of silicon is 35.0 atomic percent, the refractive index of a silicon dioxide film is 1.48. On the other hand, when the content of silicon is 36.2 atomic percent, the refractive index of a silicon dioxide film is 1.50. Accordingly, if the refractive index of a silicon-rich oxide film is 1.48 or more, then the content of silicon in the silicon-rich oxide film is 35.0 atomic percent or more, thus preventing the fluorine atoms, contained in the fluorine-containing silicon dioxide film, from passing therethrough.

FIRST FABRICATING METHOD

Hereinafter, a first method for fabricating the semiconductor device according to the first embodiment of the present invention will be described with reference to FIGS. 2(a) through 3(b).

Figure 2A:
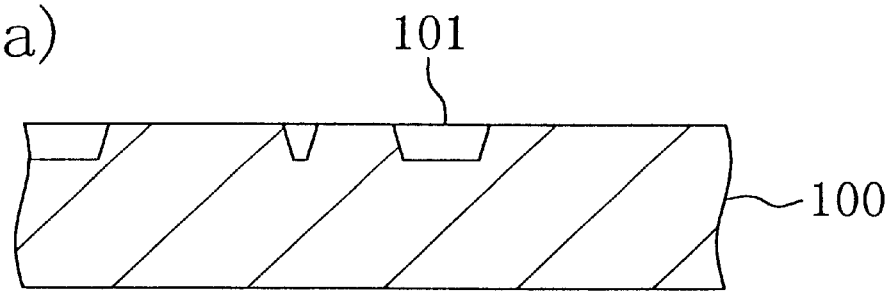
FIGS. 2(a) through 2(c) are cross-sectional views illustrating respective process steps of a first method for fabricating the semiconductor device of the first embodiment.

First, as shown in FIG. 2(a), trenches are formed in respective parts of a semiconductor (e.g., silicon) substrate 100 to be field oxide regions. Then, a silicon dioxide film is deposited by a CVD process, for example, to fill in the trenches and thereby form a field oxide film 101.

Figure 2B:
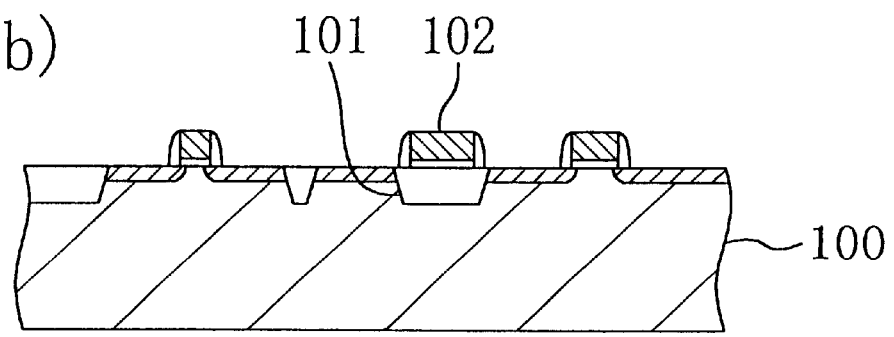
Figure 2C:
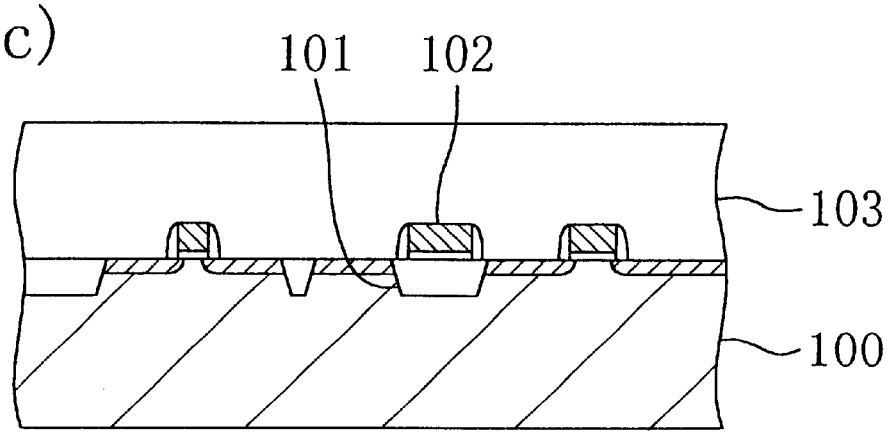

Next, as shown in FIG. 2(b), a plurality of transistors 102, each including doped layers, a gate insulating film, a gate electrode and a sidewall, are formed on the semiconductor substrate 100. In this case, the transistor 102, located at the center in FIG. 2(b), is connected to the semiconductor substrate 100 on the right- and left-hand sides of the associated part of the field oxide film 101. Thereafter, as shown in FIG. 2(c), an insulating film 103, made of silicon dioxide, is deposited over the entire surface of the semiconductor substrate 100.

Figure 3A:
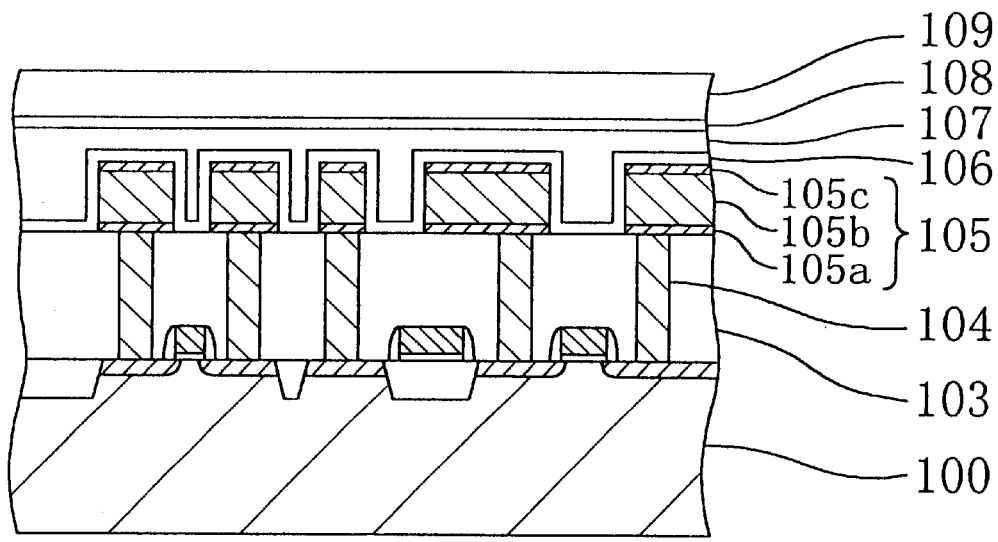
FIGS. 3(a) and 3(b) are cross-sectional views illustrating respective process steps of the first method for fabricating the semiconductor device of the first embodiment.

Subsequently, as shown in FIG. 3(a), a plurality of contact holes are formed within the insulating film 103 and filled in with tungsten by a CVD process, for example, thereby forming first contacts 104. Then, a first titanium film 105a with an exemplary thickness of 50 nm, a first aluminum alloy film 105b with an exemplary thickness of 500 nm and a first titanium nitride film 105c with an exemplary thickness of 50 nm are stacked in this order on the insulating film 103. And the first titanium film 105a, the first aluminum alloy film 105b and the first titanium nitride film 105c are patterned, thereby forming lower-level metal interconnects 105.

Then, a plasma CVD process is performed using a mixed gas of $SiH_4$, $O_2$ and Ar gases, thereby forming a first silicon-rich oxide film 106 (refractive index: 1.50) to cover the lower-level metal interconnects 105 and to be 20 nm thick, for example. The first silicon-rich oxide film 106 contains a larger quantity of silicon than that defined by stoichiometry.

Next, a plasma CVD process is performed again at 380° C. using a mixed gas of $SiH_4$, $O_2$, $SiF_4$ and Ar gases, thereby depositing a fluorine-containing silicon dioxide film 107 (relative dielectric constant: 3.6) over the first silicon-rich oxide film 106. The fluorine-containing silicon dioxide film 107 is obtained by doping a silicon dioxide film with fluorine at a concentration of 5.0 atomic percent, for example.

Subsequently, a plasma CVD process is performed again using a mixed gas of $SiH_4$, $O_2$ and Ar gases, thereby forming a second silicon-rich oxide film 108 (refractive index: 1.50) over the fluorine-containing silicon dioxide film 107. The second silicon-rich oxide film 108 also contains a larger quantity of silicon than that defined by stoichiometry.

Next, a plasma CVD process is performed again using a mixed gas of $SiH_4$, $N_2O$ and $N_2$ gases, thereby depositing a silicon dioxide film 109 (refractive index: 1.46) over the second silicon-rich oxide film 108 to be 2000 nm thick, for example. Then, the silicon dioxide film 109 is polished by a CMP technique, for example, such that the total thickness thereof is about 1000 nm. In this manner, an interlevel insulating film, consisting of the first silicon-rich oxide film 106, the fluorine-containing silicon dioxide film 107, the second silicon-rich oxide film 108 and the silicon dioxide film 109, is obtained with a planarized surface.

Figure 3B:
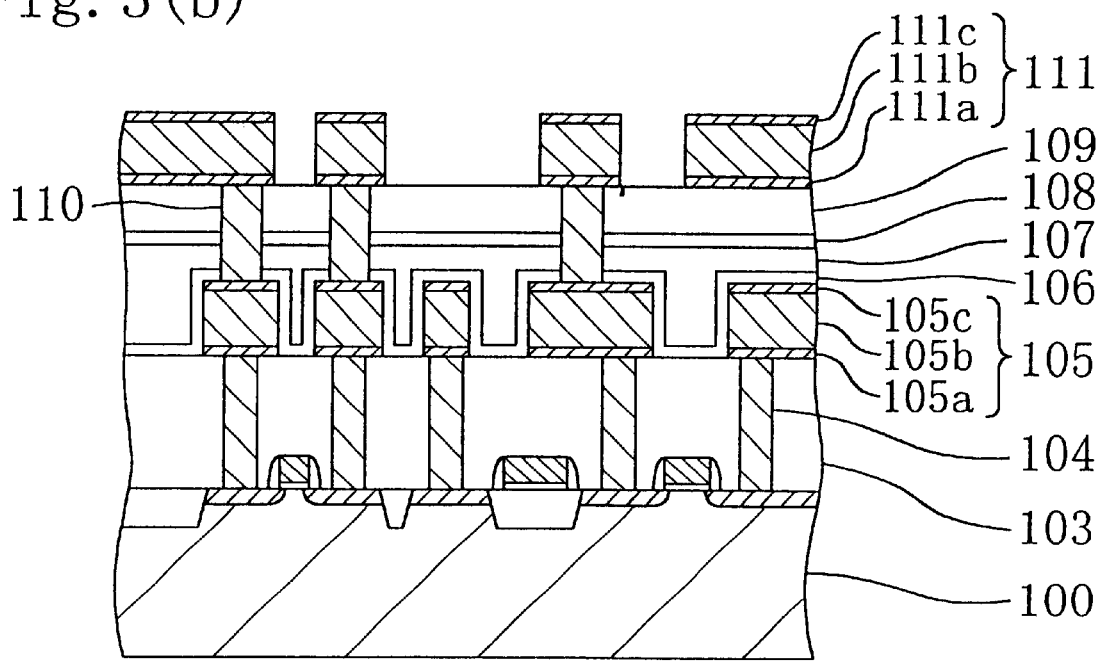

Then, as shown in FIG. 3(b), a plurality of contact holes are formed within the interlevel insulating film and filled in with tungsten by a CVD process, for example, thereby forming second contacts 110. Then, a second titanium film 111a with an exemplary thickness of 50 nm, a second aluminum alloy film 111b with an exemplary thickness of 500 nm and a second titanium nitride film 111c with an exemplary thickness of 50 nm are stacked in this order on the silicon dioxide film 109. And the second titanium film 111a, the second aluminum alloy film 111b and the second titanium nitride film 111c are patterned, thereby forming upper-level metal interconnects 111. The semiconductor device according to the first embodiment is completed in this manner.

SECOND FABRICATING METHOD

Hereinafter, a second method for fabricating the semiconductor device according to the first embodiment of the present invention will be described.

The second method is characterized by the process step of depositing the fluorine-containing silicon dioxide film 107. But the other process steps are the same as the counterparts of the first method. Thus, only the process step of depositing the fluorine-containing silicon dioxide film 107 will be described below.

In accordance with the second method, a plasma CVD process is performed at a temperature within the range from 415° C. to 460° C. using a mixed gas of $SiH_4$, $O_2$, $SiF_4$ and Ar gases, thereby depositing the fluorine-containing silicon dioxide film 107. The fluorine-containing silicon dioxide film 107 is obtained by doping a silicon dioxide film with fluorine at a concentration of 5.0 atomic percent, for example.

Next, it will be described why the plasma CVD process is performed within the temperature range from 415° C. to 460° C.

Figure 4A:
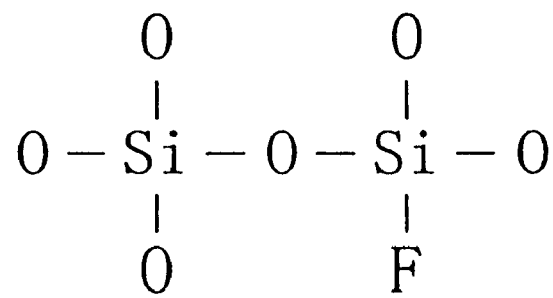
FIGS. 4(a) through 4(c) are schematic representations illustrating how Si, O and F atoms are bonded to each other in a fluorine-containing silicon dioxide film deposited by a plasma CVD process.
Figure 4B:
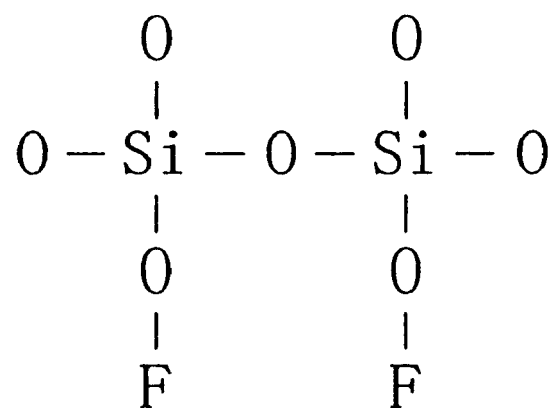
Figure 4C:
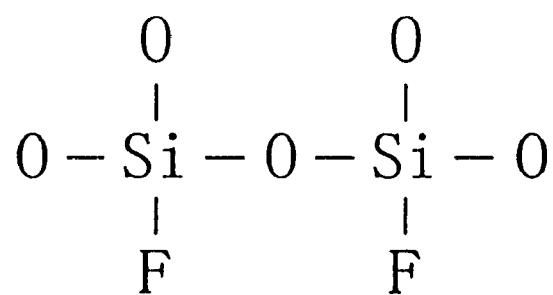

FIGS. 4(a) through 4(c) illustrate how Si, O and F atoms are bonded to each other in the fluorine-containing silicon dioxide film 107 deposited by the plasma CVD process. FIG. 4(a) illustrates a state where O and F atoms are alternately bonded to adjacent Si atoms. FIG. 4(b) illustrates a state where an F atom is bonded to each of adjacent Si atoms with an O atom interposed therebetween. And FIG. 4(c) illustrates a state where an F atom is directly bonded to each of adjacent Si atoms. If O and F atoms are alternately bonded to Si atoms as shown in FIG. 4(a), an F atom is strongly bonded to an associated Si atom. In contrast, if F atoms are bonded to Si atoms with O atoms interposed therebetween as shown in FIG. 4(b), then bonding between F and O atoms is separable more easily. And if F atoms are directly bonded to adjacent Si atoms as shown in FIG. 4(c), then bonding between F and Si atoms is separable more easily. These bonding relationships are well known in the art.

The present inventors experimentally performed plasma CVD processes at various temperatures. As a result, we found that if the plasma CVD is performed at a temperature of 415° C. or more, the bonding state shown in FIG. 4(a) is observed a greater number of times, whereas the bonding states shown in FIGS. 4(b) and 4(c) are not observed so many times. In addition, we found that if the plasma CVD is performed at a temperature of 410° C. or less, then the bonding states shown in FIGS. 4(b) and 4(c) are observed a larger number of times. And we also found that the higher the temperature setting of the plasma CVD is, the greater number of times the bonding state shown in FIG. 4(a) is observed.

Nevertheless, once the temperature for the plasma CVD exceeds 460° C., the first aluminum alloy film 105b, one of the layers for the lower-level metal interconnects 105, is more likely to melt. As a result, the cross-sectional shape of the lower-level metal interconnects 105 is gradually deformed.

Accordingly, the plasma CVD process is preferably performed within the temperature range from 415° C. to 460° C.

Figure 5:
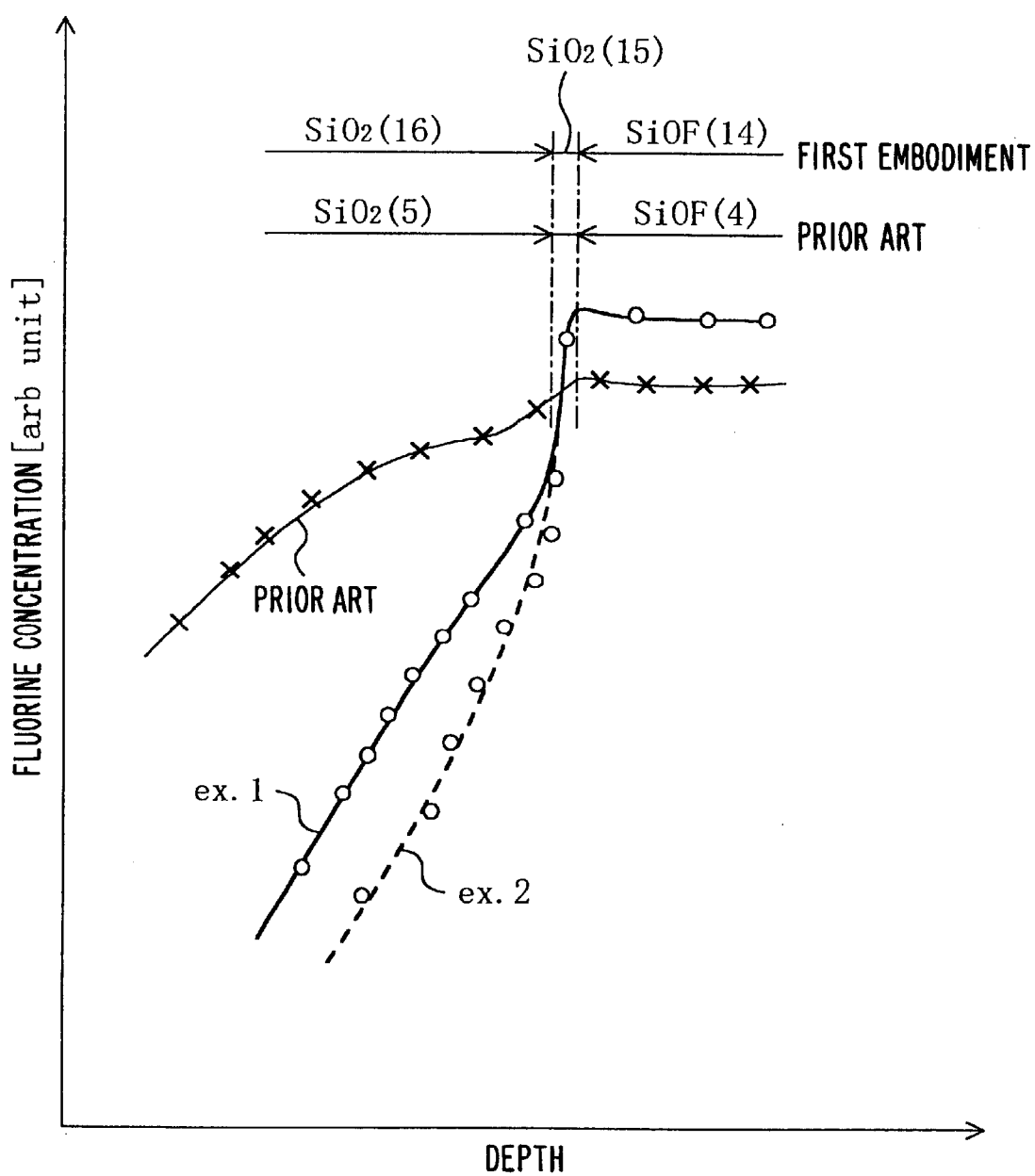
FIG. 5 is a graph illustrating variations in concentration of fluorine in respective interlevel insulating films formed by a conventional method and the first and second methods of the present invention as measured in the depth direction.

FIG. 5 illustrates variations in concentration of fluorine in respective interlevel insulating films formed by a conventional method (labeled as "prior art" in FIG. 5) and first and second methods of the present invention (labeled as "ex. 1" and "ex. 2" in FIG. 5, respectively) as measured in the depth direction. It should be noted that FIG. 5 illustrates data measured by secondary ion mass spectroscopy (SIMS). In FIG. 5, $SiO_2$ (5) and (16) is a region corresponding to a silicon dioxide film not doped with fluorine; $SiO_2$ (15) is a region corresponding to a silicon-rich oxide film; and $SiO_2$ (4) and (14) is a region corresponding to a fluorine-containing silicon dioxide film.

As can be seen from FIG. 5, the concentration of fluorine in the fluorine-containing silicon dioxide film is higher in the first embodiment (ex. 1 and ex. 2) than in the prior art. At the same depth from the surface, the concentrations of fluorine in the silicon dioxide films are lower in the first embodiment than in the prior art. Also, in the first embodiment (ex. 1 and ex. 2), the concentration of fluorine varies to a large degree in the region corresponding to the silicon-rich oxide film. Furthermore, at the same depth from the surface, the concentration of fluorine in the silicon dioxide film is lower in ex. 2 than in ex. 1.

Accordingly, it was confirmed that a smaller number of F atoms diffuse toward the silicon dioxide film in the interlevel insulating film of the first embodiment than in the conventional interlevel insulating film. And it was also confirmed that a smaller number of F atoms diffuse toward the silicon dioxide film in the interlevel insulating film formed by the second method than the interlevel insulating film formed by the first method.

Embodiment 2

Hereinafter, a method for fabricating a semiconductor device according to the second embodiment of the present invention will be described with reference to FIG. 6.

Figure 6:
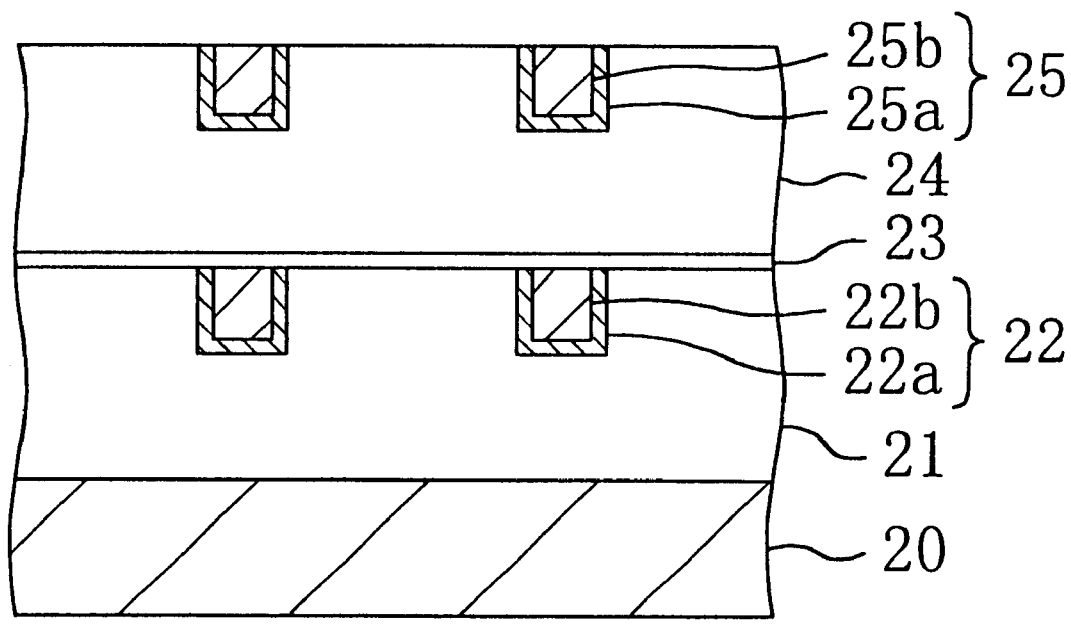
FIG. 6 is a cross-sectional view of a semiconductor device according to the second embodiment of the present invention.

FIG. 6 illustrates a cross-sectional structure of the semiconductor device according to the second embodiment. As shown in FIG. 6, a first fluorine-containing silicon dioxide film 21, obtained by doping a silicon dioxide film with fluorine at a concentration of 5.0 atomic percent, for example, is formed on a semiconductor substrate 20. And lower-level metal interconnects 22 are buried in the first fluorine-containing silicon dioxide film 21. Each of these lower-level metal interconnects 22 consists of: a first barrier layer 22a made of titanium nitride or tantalum nitride; and a first copper film 22b.

A silicon-rich nitride film 23, containing a larger quantity of silicon than that defined by stoichiometry, is formed over the entire surface of the first fluorine-containing silicon dioxide film 21 and the lower-level metal interconnects 22.

A second fluorine-containing silicon dioxide film 24, obtained by doping a silicon dioxide film with fluorine at a concentration of 5.0 atomic percent, for example, is formed on the silicon-rich nitride film 23. And upper-level metal interconnects 25 are buried in the second fluorine-containing silicon dioxide film 24. Each of these upper-level metal interconnects consists of: a second barrier layer 25a made of titanium nitride or tantalum nitride; and a second copper film 25b.

In the second embodiment, the silicon-rich nitride film 23 is formed under the second fluorine-containing silicon dioxide film 24. During a subsequent heat treatment process, fluorine atoms, contained in the second fluorine-containing silicon dioxide film 24, are going to diffuse downward. However, there are a great number of silicon atoms having extra bonds, or dangling bonds, in the silicon-rich nitride film 23. Accordingly, the fluorine atoms are trapped by the dangling bonds of the silicon atoms contained in the silicon-rich nitride film 23. That is to say, only a very small number of fluorine atoms, contained in the second fluorine-containing silicon dioxide film 24, can reach the lower-level metal interconnects 22. Thus, no degraded layers are formed in the interface between the lower-level metal interconnects 22 and the interlevel insulating film. As a result, the contact between the lower-level metal interconnects 22 and the interlevel insulating film improves.

Particularly, in the second embodiment, a silicon-rich nitride film with a relatively high film density of 2.7 g/cm$^3$ is formed instead of the silicon-rich oxide film of the first embodiment with a relatively low film density of 2.3 g/cm$^3$. Accordingly, it is harder for the fluorine atoms, contained in the second fluorine-containing silicon dioxide film 24, to pass through the silicon-rich nitride film 23.

The quantity of silicon contained in the silicon-rich nitride film 23 will be exemplified. The content of silicon in an ordinary silicon nitride ($Si_3N_4$) film is defined by stoichiometry at about 43 atomic percent (=3/7). In contrast, the content of silicon in the silicon-rich nitride film 23 is preferably about 45 atomic percent or more. This is because if the content of silicon is about 45 atomic percent or more, then the passage of fluorine atoms, contained in the second fluorine-containing silicon dioxide film 24 at a concentration of 5.0 atomic percent, for example, can be prevented with much more certainty.

A refractive index of a silicon nitride film is also often used as a barometer for measuring the concentration of silicon contained in the silicon nitride film. For example, when the content of silicon is 45 atomic percent, the refractive index of a silicon nitride film is 2.05. Accordingly, if the refractive index of a silicon-rich nitride film is 2.05 or more, then the content of silicon in the silicon-rich nitride film is 45 atomic percent or more, thus preventing the fluorine atoms, contained in the fluorine-containing silicon dioxide film, from passing therethrough.

The first and second barrier layers 22a and 25a are provided to prevent oxygen atoms, contained in the first and second fluorine-containing silicon dioxide films 21 and 24, from diffusing toward the first and second copper films 22b and 25b, respectively. These layers 22a and 25a are also provided to prevent copper atoms, contained in the first and second copper films 22b and 25b, from diffusing toward the first and second fluorine-containing silicon dioxide films 21 and 24, respectively. Also, the first and second barrier layers 22a and 25a are made of highly dense titanium nitride or tantalum nitride. Therefore, these layers 22a and 25a can prevent fluorine atoms, contained in the first and second fluorine-containing silicon dioxide films 21 and 24, from diffusing toward the first and second copper films 22b and 25b of the lower- and upper-level metal interconnects 22 and 25, respectively.

FABRICATING METHOD

Next, a method for fabricating the semiconductor device according to the second embodiment of the present invention will be described with reference to FIGS. 7 and 8.

Figure 7A:
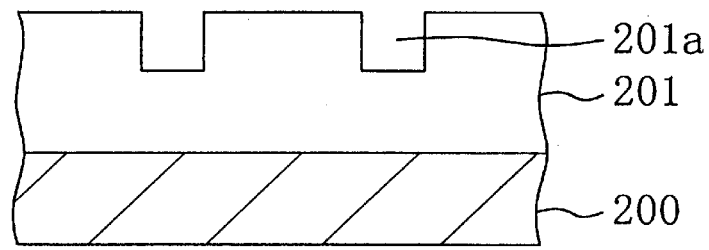
FIGS. 7(a) through 7(c) are cross-sectional views illustrating respective process steps for fabricating the semiconductor device of the second embodiment.

First, as shown in FIG. 7(a), a plasma CVD process is performed using a mixed gas of $SiH_4$, $O_2$, $SiF_4$ and Ar gases, thereby depositing a first fluorine-containing silicon dioxide film 201 over a semiconductor (e.g., silicon) substrate 200. The first fluorine-containing silicon dioxide film 201 is obtained by doping a silicon dioxide film with fluorine at a concentration of 5.0 atomic percent, for example. Thereafter, first-level interconnect recesses 201a are formed in respective regions of the first fluorine-containing silicon dioxide film 201 where lower-level metal interconnects are to be formed.

Figure 7B:
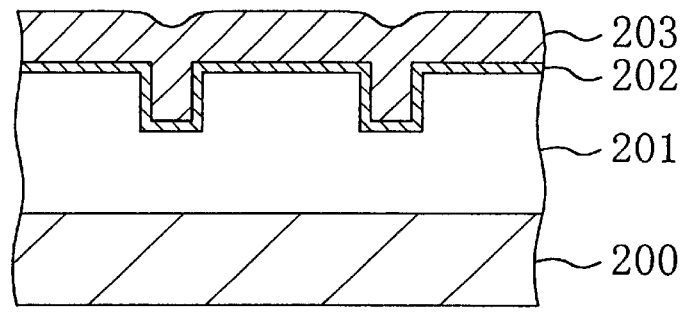

Next, as shown in FIG. 7(b), sputtering is performed within a nitrogen ambient using titanium or tantalum target, thereby depositing a first barrier layer 202, made of titanium nitride or tantalum nitride, over the entire surface of the semiconductor substrate 200 as well as the first-level interconnect recesses 201a. Then, a first copper film 203 is deposited by a plating technique over the entire surface of the first barrier layer 202.

Figure 7C:
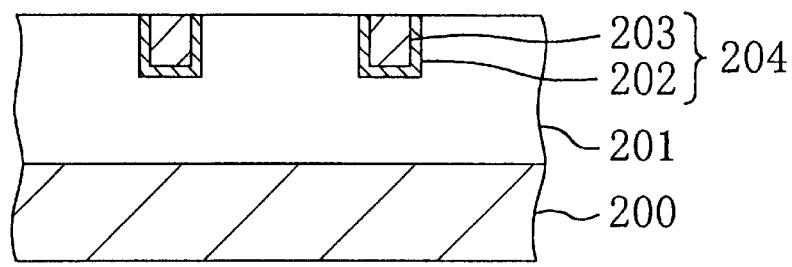

Subsequently, as shown in FIG. 7(c), respective portions of the first barrier layer 202 and the first copper film 203, which are located on the surface of the first fluorine-containing silicon dioxide film 201, are removed by a CMP technique, for example. As a result, lower-level metal interconnects 204 are formed out of the first barrier layer 202 and the first copper film 203.

Figure 8A:
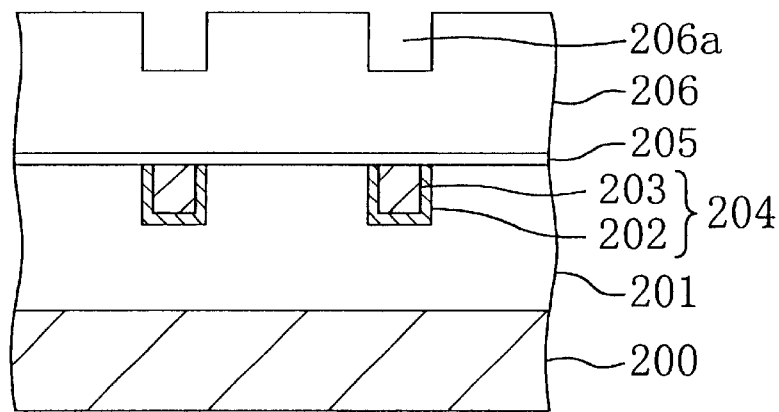
FIGS. 8(a) and 8(b) are cross-sectional views illustrating respective process steps for fabricating the semiconductor device of the second embodiment.

Then, as shown in FIG. 8(a), a plasma CVD process is performed using a mixed gas of $SiH_4$, $NH_3$ and $N_2$ gases, thereby forming a silicon-rich nitride film 205 (refractive index: 2.05) over the entire surface of the semiconductor substrate 200 to cover the lower-level metal interconnects 204. The silicon-rich nitride film 205 contains a larger quantity of silicon than that defined by stoichiometry.

Thereafter, a plasma CVD process is performed again using a mixed gas of $SiH_4$, $O_2$, $SiF_4$ and Ar gases, thereby depositing a second fluorine-containing silicon dioxide film 206 on the silicon-rich nitride film 205. The second fluorine-containing silicon dioxide film 206 is obtained by doping a silicon dioxide film with fluorine at a concentration of 5.0 atomic percent, for example. Then, second-level interconnect recesses 206a are formed in respective regions of the second fluorine-containing silicon dioxide film 206 where upper-level metal interconnects are to be formed.

Figure 8B:
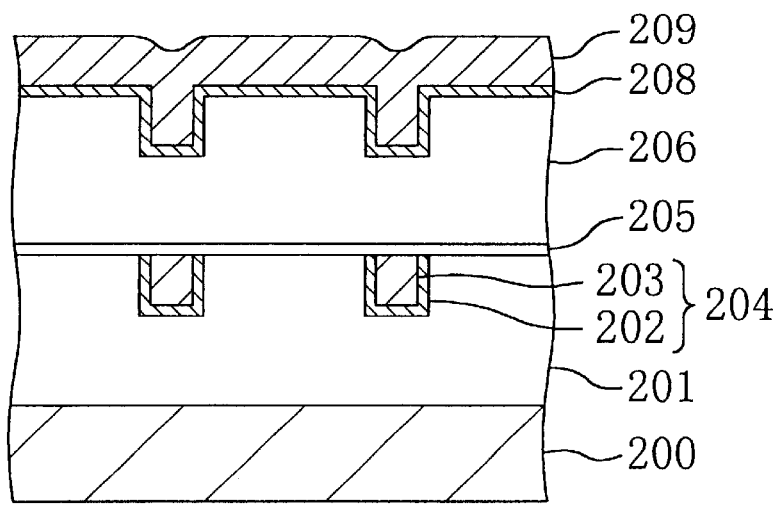
Figure 9:
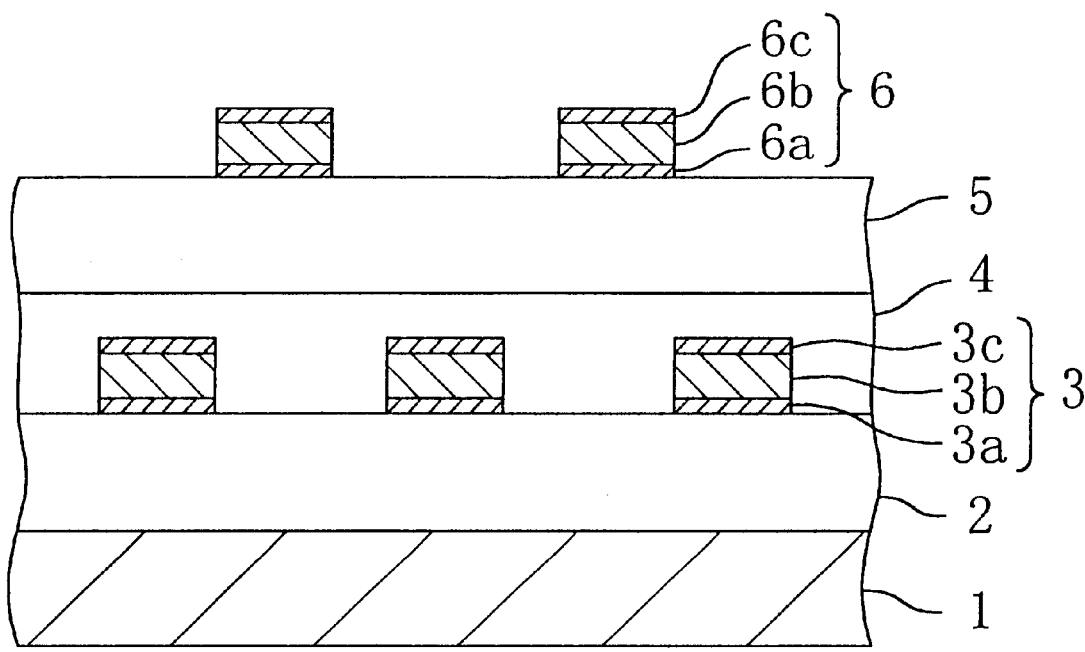
FIG. 9 is a cross-sectional view of a conventional semiconductor device.

Next, as shown in FIG. 8(b), sputtering is performed within a nitrogen ambient using titanium or tantalum target, thereby depositing a second barrier layer 208, made of titanium nitride or tantalum nitride, over the entire surface of the semiconductor substrate 200 as well as the second-level interconnect recesses 206a. Then, a second copper film 209 is deposited by a plating technique over the entire surface of the second barrier layer 208.

Subsequently, respective portions of the second barrier layer 208 and the second copper film 209, which are located on the surface of the second fluorine-containing silicon dioxide film 206, are removed by a CMP technique, for example. As a result, upper-level metal interconnects are formed out of the second barrier layer 208 and the second copper film 209. In this manner, the semiconductor device according to the second embodiment shown in FIG. 6 is completed.

In the foregoing first and second embodiments, a fluorine-containing silicon dioxide film, formed by doping a silicon dioxide film with fluorine, is used as an exemplary fluorine-containing insulating film doped with fluorine. Alternatively, a fluorine-containing silicon nitride film, formed by doping a silicon nitride film with fluorine, may also be used.

What is claimed is:

1. A method for fabricating a semiconductor device, comprising the steps of:

forming lower-level metal interconnects over a semiconductor substrate;

depositing a first silicon-rich insulating film containing a larger quantity of silicon than a quantity defined by stoichiometry so as to cover the lower-level metal interconnects with a recess being formed between each of the lower-level metal interconnects covered with the first silicon-rich insulating film;

depositing a fluorine-containing insulating film being made of a fluorine-doped insulator on the first silicon-rich insulating film so as to fill the recess between each of the lower-level metal interconnects covered with the first silicon-rich insulating film;

depositing a second silicon-rich insulating film containing a larger quantity of silicon than a quantity defined by stoichiometry;

depositing a silicon-containing insulating film containing silicon in a quantity defined by stoichiometry over the second silicon-rich insulating film; and forming upper-level metal interconnects over the silicon-containing insulating film.

2. The method of claim 1, wherein each of the first silicon-rich insulating film and the second silicon-rich insulating film is a silicon-rich oxide film containing a larger quantity of silicon than a quantity defined by stoichiometry.

3. The method of claim 1, wherein each of the first silicon-rich insulating film and the second silicon-rich insulating film is a silicon-rich nitride film containing a larger quantity of silicon than a quantity defined by stoichiometry.

4. The method of claim 1, wherein the fluorine-containing insulating film is a fluorine-containing silicon dioxide film formed by doping a silicon dioxide film with fluorine.

5. The method of claim 4, wherein the fluorine-containing silicon dioxide film is deposited by a plasma CVD at a temperature in the range from 415° C. to 460° C.

* * * * *